(12) United States Patent
Revier et al.

(10) Patent No.: US 10,833,648 B2
(45) Date of Patent: Nov. 10, 2020

(54) ACOUSTIC MANAGEMENT IN INTEGRATED CIRCUIT USING PHONONIC BANDGAP STRUCTURE

(71) Applicant: Texas Instruments Incorporated, Dallas, TX (US)

(72) Inventors: Daniel Lee Revier, Addison, TX (US); Benjamin Stassen Cook, Addison, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 19 days.

(21) Appl. No.: 15/792,591

(22) Filed: Oct. 24, 2017

(65) Prior Publication Data

US 2019/0123711 A1    Apr. 25, 2019

(51) Int. Cl.
*H03H 9/02* (2006.01)
*H01L 23/28* (2006.01)
(Continued)

(52) U.S. Cl.
CPC ....... *H03H 9/02653* (2013.01); *B06B 1/0644* (2013.01); *G01H 11/08* (2013.01); *G10K 15/046* (2013.01); *H01L 23/28* (2013.01); *H01L 23/295* (2013.01); *H01L 23/3121* (2013.01); *H01L 24/32* (2013.01); *H01L 24/45* (2013.01); *H01L 24/48* (2013.01); *H03H 3/0073* (2013.01); *H03H 9/0211* (2013.01); *H03H 9/02086* (2013.01); *H03H 9/02118* (2013.01); *H03H 9/02637* (2013.01); *H03H 9/1057* (2013.01);
(Continued)

(58) Field of Classification Search
CPC .............. B06B 1/0644; H03H 9/02653; H03H 9/02637
See application file for complete search history.

(56) References Cited

U.S. PATENT DOCUMENTS 3,868,759 A    3/1975    Hartleroad et al.
3,868,764 A    3/1975    Hartleroad et al.
(Continued)

FOREIGN PATENT DOCUMENTS

| RU | 1780469 A1 | 10/1995 |
|----|------------|---------|
| WO | 2006101577 A2 | 9/2006 |
| WO | 2017111892 | 6/2017 |

OTHER PUBLICATIONS

International Search Report for PCT/US2018/049166 dated Dec. 13, 2018.
(Continued)

*Primary Examiner* — Zandra V Smith
*Assistant Examiner* — Abbigale A Boyle
(74) *Attorney, Agent, or Firm* — Michael A. Davis, Jr.; Charles A. Brill; Frank D. Cimino

(57) ABSTRACT

An encapsulated integrated circuit is provided that includes an integrated circuit (IC) die. A phonon device is fabricated on the IC die that is configured to emit or to receive phonons that have a range of ultrasonic frequencies. An encapsulation material encapsulates the IC die. A phononic bandgap structure is included within the encapsulation material that is configured to have a phononic bandgap with a frequency range that includes at least a portion of the range of ultrasonic frequencies. A phononic channel is located in the phononic bandgap structure between the phonon device and a surface of the encapsulated IC.

17 Claims, 11 Drawing Sheets

(51) Int. Cl.
  *B06B 1/06* (2006.01)
  *H03H 3/007* (2006.01)
  *H01L 23/00* (2006.01)
  *H03H 9/10* (2006.01)
  *H04R 17/00* (2006.01)
  *G01H 11/08* (2006.01)
  *G10K 15/04* (2006.01)
  *H01L 23/29* (2006.01)
  *H01L 23/31* (2006.01)
  *G01N 29/34* (2006.01)

(52) U.S. Cl.
  CPC ............ *H04R 17/00* (2013.01); *G01N 29/348* (2013.01); *H01L 24/73* (2013.01); *H01L 24/85* (2013.01); *H01L 24/97* (2013.01); *H01L 2224/05* (2013.01); *H01L 2224/32013* (2013.01); *H01L 2224/32245* (2013.01); *H01L 2224/48091* (2013.01); *H01L 2224/48247* (2013.01); *H01L 2224/73265* (2013.01); *H01L 2924/00014* (2013.01); *H01L 2924/14* (2013.01); *H01L 2924/181* (2013.01)

(56) References Cited

U.S. PATENT DOCUMENTS

| | | | |
|---|---|---|---|
| 4,974,590 A * | 12/1990 | Saito | A61B 8/12 600/462 |
| 4,999,587 A | 3/1991 | Evans | |
| 5,355,577 A | 10/1994 | Cohn | |
| 5,500,912 A | 3/1996 | Alonas et al. | |
| 5,528,074 A | 6/1996 | Goto et al. | |
| 5,834,320 A | 11/1998 | Huddleston et al. | |
| 6,664,615 B1 | 12/2003 | Bayan et al. | |
| 6,967,347 B2 | 11/2005 | Estes et al. | |
| 6,979,105 B2 | 12/2005 | Leysath | |
| 7,228,016 B2 | 6/2007 | Beausoleil | |
| 7,305,161 B2 | 12/2007 | Zhou | |
| 7,733,198 B1 * | 6/2010 | Olsson | G10K 11/20 333/187 |
| 8,031,012 B2 | 10/2011 | Hasegawa | |
| 8,054,145 B2 * | 11/2011 | Mohammadi | H01L 41/107 333/186 |
| 8,094,023 B1 | 1/2012 | El-Kady et al. | |
| 8,138,868 B2 | 3/2012 | Arnold | |
| 8,143,637 B2 | 3/2012 | Kanatake | |
| 8,587,182 B2 * | 11/2013 | Reiche | G01S 7/521 310/322 |
| 9,018,074 B2 | 4/2015 | Zhang et al. | |
| 9,070,703 B2 | 6/2015 | Haroun et al. | |
| 9,123,737 B2 | 9/2015 | Haroun et al. | |
| 9,343,426 B1 | 5/2016 | Parvarandeh | |
| 9,373,878 B2 | 6/2016 | Schuppener et al. | |
| 9,450,563 B2 * | 9/2016 | Gorisse | H03H 9/02086 |
| 9,583,811 B2 | 2/2017 | Seler et al. | |
| 9,647,329 B2 | 5/2017 | Herbsommer et al. | |
| 9,651,718 B2 * | 5/2017 | Chen | G02B 3/08 |
| 10,062,583 B2 * | 8/2018 | Costa | H01L 23/645 |
| 10,139,564 B1 | 11/2018 | Homeijer et al. | |
| 2005/0224956 A1 | 10/2005 | Kao et al. | |
| 2006/0038168 A1 | 2/2006 | Estes et al. | |
| 2006/0054780 A1 | 3/2006 | Garrood et al. | |
| 2007/0108545 A1 | 5/2007 | Chua et al. | |
| 2008/0112665 A1 | 5/2008 | Beausoleil et al. | |
| 2008/0218299 A1 | 9/2008 | Arnold | |
| 2009/0288852 A1 | 11/2009 | Hirokawa et al. | |
| 2010/0019247 A1 | 1/2010 | Joichi et al. | |
| 2011/0001233 A1 | 1/2011 | Iwase et al. | |
| 2011/0089815 A1 | 4/2011 | Yeh et al. | |
| 2011/0103632 A1 * | 5/2011 | Leclair | H04R 1/30 381/340 |
| 2011/0133597 A1 | 6/2011 | Pavlov et al. | |
| 2011/0221057 A1 | 9/2011 | Lin et al. | |
| 2012/0043628 A1 * | 2/2012 | Martin | B81B 7/0048 257/416 |
| 2012/0098611 A1 | 4/2012 | Sinha et al. | |
| 2012/0154168 A1 | 6/2012 | Duncan et al. | |
| 2013/0038174 A1 * | 2/2013 | Kim | H01L 41/053 310/327 |
| 2013/0228796 A1 | 9/2013 | Mieczkowski | |
| 2014/0287703 A1 | 9/2014 | Herbsommer et al. | |
| 2014/0326902 A1 | 11/2014 | Tahan et al. | |
| 2015/0237423 A1 | 8/2015 | Bahr et al. | |
| 2015/0295305 A1 | 10/2015 | Herbsommer et al. | |
| 2016/0028367 A1 | 1/2016 | Shealy | |
| 2016/0276311 A1 | 9/2016 | Meyer et al. | |
| 2016/0327977 A1 | 11/2016 | Tang et al. | |
| 2017/0084519 A1 | 3/2017 | Speight et al. | |
| 2017/0108655 A1 | 4/2017 | Zarbock et al. | |
| 2017/0186793 A1 | 6/2017 | Ockenfuss | |
| 2017/0253476 A1 | 9/2017 | Shibuya et al. | |
| 2017/0276870 A1 | 9/2017 | Snyman | |
| 2017/0288123 A1 | 10/2017 | Hatano et al. | |
| 2017/0292884 A1 * | 10/2017 | Ching, Jr. | G01L 9/0042 |
| 2019/0128735 A1 | 5/2019 | Cook et al. | |

OTHER PUBLICATIONS

International Search Report for PCT/US2018/049135 dated Dec. 13, 2018.
Benjamin Stassen Cook and Daniel Lee Revier, "Thermal Management in Integrated Circuit Using Phononic Bandgap Structure", U.S. Appl. No. 15/92,580, filed Oct. 24, 2017, pp. 1-33.
Benjamin Stassen Cook and Daniel Lee Revier, "Electromagnetic Interference Shield within Integrated Circuit Encapsulation Using Photonic Bandgap Structure", U.S. Appl. No. 15/799,757, filed Oct. 31, 2017, pp. 1-38.
Benjamin Stassen Cook and Daniel Lee Revier, "integrated Circuit with Dielectric Waveguide Connector Using Photonic Bandgap Structure", U.S. Appl. No. 15/800,042, filed Oct. 31, 2017, pp. 1-42.
Benjamin Stassen Cook and Daniel Lee Revier, "Galvanic Signal Path Isolation in an Encapsulated Package Using a Photonic Structure", U.S. Appl. No. 15/799,740, filed Oct. 31, 2017, pp. 1-38.
Benjamin Stassen Cook and Daniel Lee Revier, "Spectrometry in Integrated Circuit Using a Photonic Bandgap Structure", U.S. Appl. No. 15/800,009, filed Oct. 31, 2017, pp. 1-41.
International Search Report for PCT/US2018/058478 dated Feb. 14, 2019.
Mohammadi, et al. Complete phononic bandgaps and bandgap maps in two-dimensional silicon phononic crystal plates; Electronics Letters Aug. 2, 2017, vol. 43 No. 16. 2 pages.
International Search Report for PCT/US2018/058481 dated Feb. 7, 2019.
International Search Report for PCT/US2018/058487 dated Feb. 7, 2019.
International Search Report for PCT/US2018/057358 dated Feb. 7, 2019.
International Search Report for PCT/US2018/057351 dated Feb. 7, 2019.
Optical Sensor-On-Chip ICs Simplify Handheld Spectrometer Design, available at https://www.digikey.com/en/articles/techzone/2017/jun/optical-sensor-on-chip-ics-simplify-handheld-spectrometer-design, Digi-Key Electronics, Jun. 28, 2017, pp. 1-6.
Hideo Kosaka et al, "Self-Collimating Phenomena in Photonic Crystals", Applied Physics Letters, vol. 74, No. 9, Mar. 1, 1999, pp. 1212-1214.
"Phonon", Wikipedia, available at https://en.wikipedia.org/wiki/Phonon on Aug. 2, 2017, pp. 1-9.
Yan Pennec and Bahram Djafari-Rouhani, "Fundamental Properties of Phononic Crystal", Chapter 2 in "Phononic Crystals", 2016, pp. 23-50.
Daniel Frederic Sievenpiper, "High-Impedance Electromagnetic Surfaces", 1999, University of California, pp. 1-162.
"7 Families of Additive Manufacturing", According to ASTM F2792 Standards, Hybrid Manufacturing Technologies, pp. 1-2.
"Standard Terminology for Additive Manufacturing Technologies", ASTM International, F2792-12a,Sep. 9, 2013, pp. 1-3.

(56) References Cited

OTHER PUBLICATIONS

Nagi Elabbasi, "Modeling Phononic Band Gap Materials and Structures", Comsol Blog, Feb. 10, 2016, pp. 1-7.
Dr. Qin Hu, "Multiphoton Lithograpy Based 3D Micro/Nano Printing", EPSRC Centre for Innovative Manufacturing in Additive Manufacturing, pp. 1-30.
International Search Report for PCT/US2018/058494 dated Feb. 21, 2019.

* cited by examiner

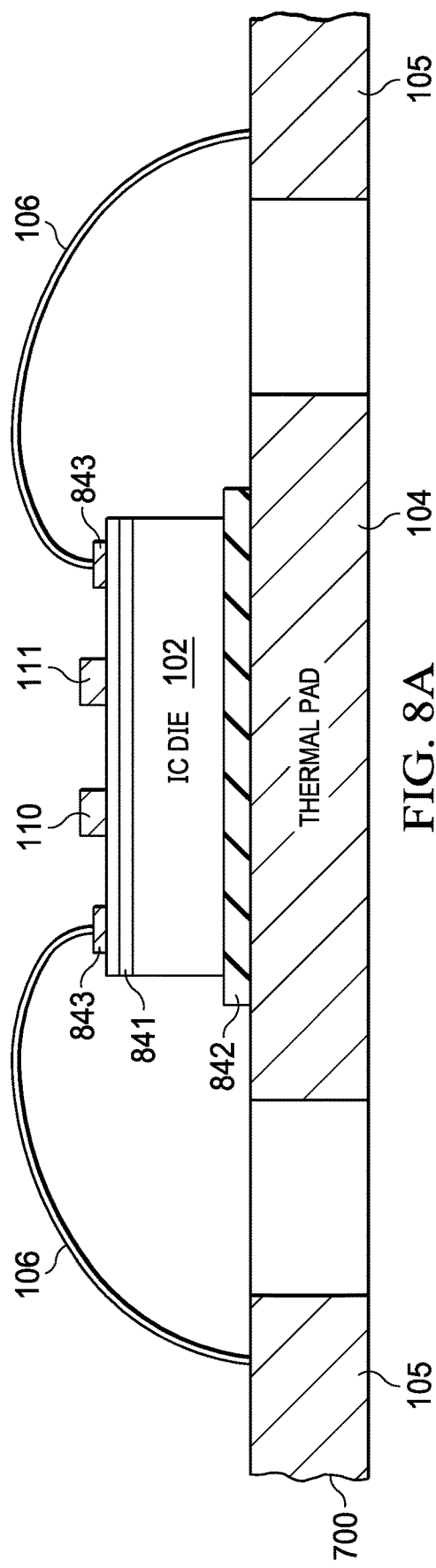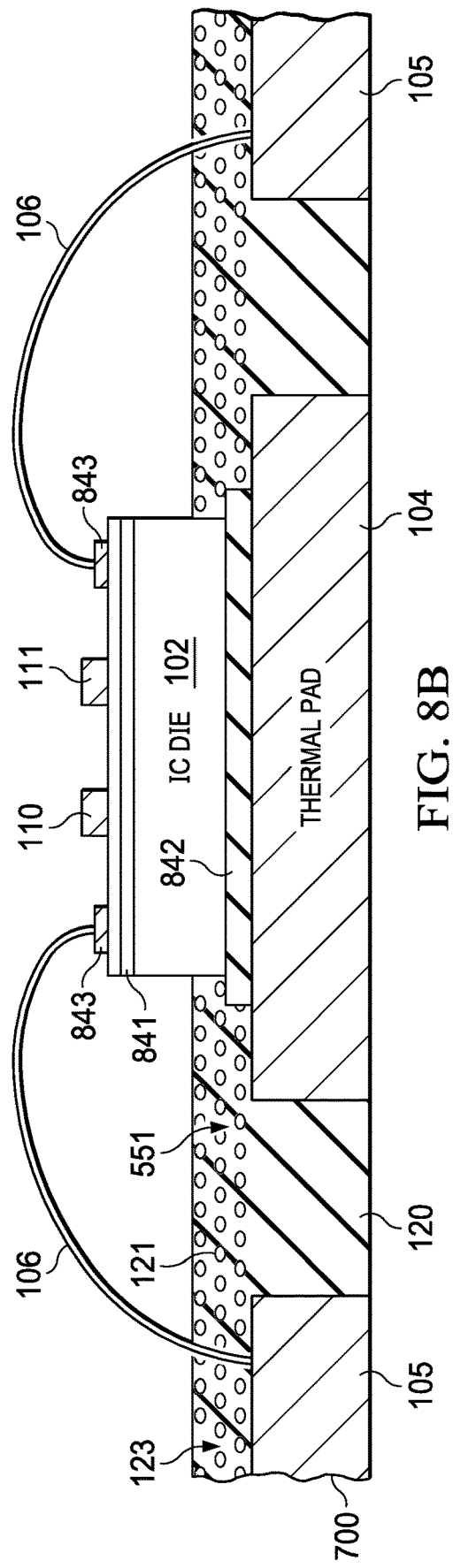

ACOUSTIC MANAGEMENT IN INTEGRATED CIRCUIT USING PHONONIC BANDGAP STRUCTURE

FIELD OF THE DISCLOSURE

This disclosure relates to an integrated circuit package that includes a phononic band gap structure in the package.

BACKGROUND OF THE DISCLOSURE individual discrete components are typically fabricated on a silicon wafer before being cut into separate semiconductor the and assembled in a package. The package provides protection against impact and corrosion, holds the contact pins or leads which are used to connect from external circuits to the device, and dissipates heat produced in the device.

Wire bonds may be used to make electrical connections between an integrated circuit and the leads of the package with fine wires connected from the package leads and bonded to conductive pads on the semiconductor die. The leads external to the package may be soldered to a printed circuit board. Modern surface mount devices eliminate the need for drilled holes through circuit boards and have short metal leads or pads on the package that can be secured by reflow soldering.

Many devices are encapsulated with an epoxy plastic that provides adequate protection of the semiconductor devices and mechanical strength to support the leads and handling of the package. Some integrated circuits have no-lead packages such as quad-flat no-leads (QFN) and dual-flat no-leads (DFN) devices that physically and electrically couple it circuits to printed circuit boards. Flat no-lead devices, also known as micro leadframe (MLF) and small outline no-leads (SON) devices, are based on a surface-mount technology that connects integrated circuits to the surfaces of printed circuit boards without through-holes in the printed circuit boards. Perimeter lands on the package provide electrical coupling to the printed circuit board.

BRIEF DESCRIPTION OF THE DRAWINGS

Particular embodiments in accordance with the disclosure will now be described, by way of example only, and with reference to the accompanying drawings:

FIGS. 8A-8C illustrate formation of a phononic bandgap structure using an additive manufacture process to encapsulate an IC;

Figure 1:
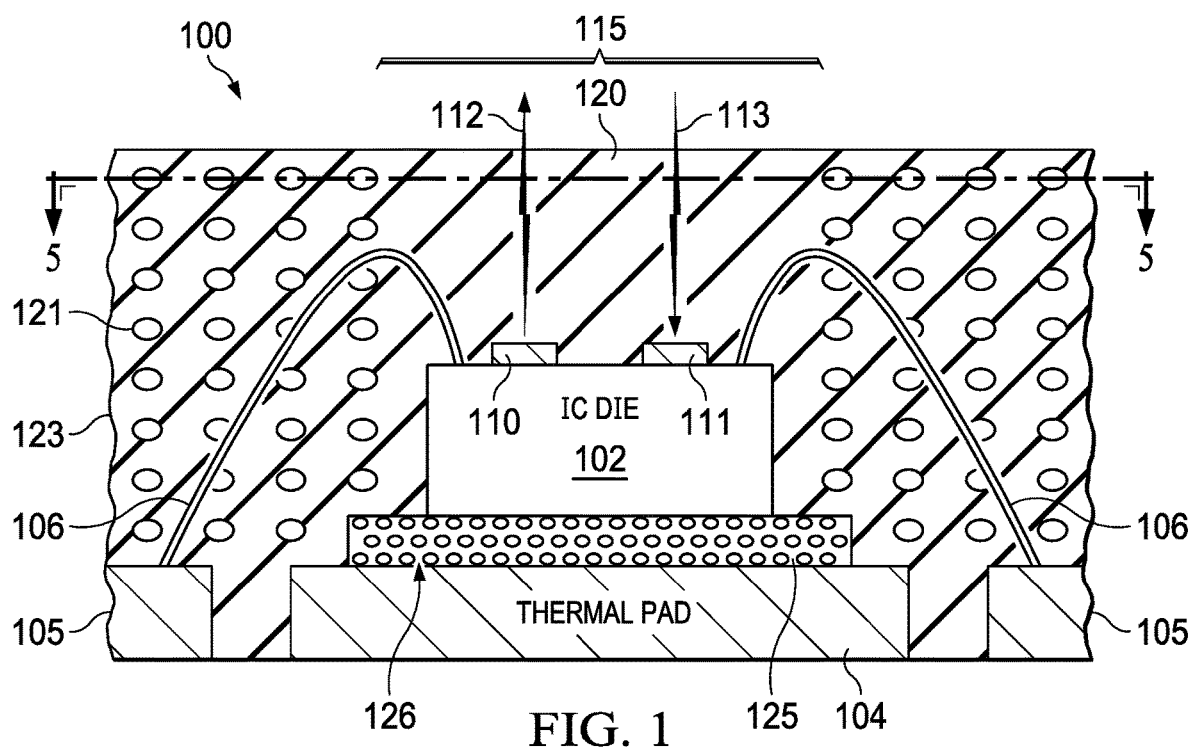
FIG. 1 is an example integrated circuit (IC) package that includes a phononic bandgap structure.

Other features of the present embodiments will be apparent from the accompanying drawings and from the detailed description that follows.

DETAILED DESCRIPTION OF EMBODIMENTS OF THE DISCLOSURE

Specific embodiments of the disclosure will now be described in detail with reference to the accompanying figures. Like elements in the various figures are denoted by like reference numerals for consistency. In the following detailed description of embodiments of the disclosure, numerous specific details are set forth in order to provide a more thorough understanding of the disclosure. However, it will be apparent to one of ordinary skill in the art that the disclosure may be practiced without these specific details. In other instances, well-known features have not been described in detail to avoid unnecessarily complicating the description.

The epoxy encapsulant for semiconductor chips/packages has typically served the primary purpose of providing environmental and mechanical protection for the integrated circuit (IC). Previously, in order for an additional package function to be added, it must be added before or after the encapsulation step. Performing additional packaging steps may increase cost and limit functionality on the processes that can be performed. A method for encapsulating an IC will now be disclosed in which a structure to perform an additional package function may be created during the process of encapsulation.

In physics, a phonon is a collective excitation in a periodic, elastic arrangement of atoms or molecules in condensed matter, like solids and some liquids. Often designated a quasiparticle, it represents an excited state in the quantum mechanical quantization of the modes of vibrations of elastic structures of interacting particles. Viewing a phonon as a particle, a quantum of vibration, it can be said that a phonon carries energy just like a molecule.

Additive manufacturing has enabled the deposition of patterned materials in a rapid and cost efficient manner. By utilizing additive manufacturing, control structures may be integrated directly into the encapsulation material of an IC. As will be disclosed herein, high frequency phononic devices, such as an ultrasound generator and/or receiver device may be provided in the encapsulation of an IC package through the implementation of multi-material phononic bandgap (PBG) structures within the encapsulation.

FIG. 1 is an example integrated circuit (IC) package 100 that includes a phononic bandgap structure within the encapsulant material 120. IC die 102 may be attached to a thermal pad 104 of a leadframe that includes a set of contacts 105. IC die 100 may also be referred to as a "chip." IC die 102 may be fabricated using known or later developed semiconductor processing techniques. IC die 102 may include an epitaxial (epi) layer on the top surface in which are formed various semiconductor transistor devices and interconnects. One or more conductive layers may be formed on the epi layer and patterned into interconnect traces and bond pads. A set of bond wires 106 may be attached to contacts 105 and bond pads located on the surface of IC die 106 using known or later developed wire bonding techniques. In this example, IC package 100 is a quad flat no-leads (QFN) package; however, in other embodiments various known or later developed packaging configurations, such as DFN, MLF, SON, dual inline packages (DIP), etc, may be fabricated using the techniques disclosed herein to form an encapsulated package with a phononic bandgap structure included within the encapsulant material.

A phononic emitter device 110 may be fabricated on IC die 102 using known or later developed processing techniques. Phononic device 110 may be fabricated using a piezoelectric material, for example. Phononic device 110 may be designed to emit ultrasonic sound waves in the form of phonons.

Ultrasound is sound waves with frequencies higher than the upper audible limit of human hearing. Ultrasound devices may operate with frequencies from 20 kHz up to several gigahertz. Ultrasound is used in many different fields. For example, ultrasonic devices may be used to detect objects and measure distances. Ultrasound imaging or sonography is often used in medicine. In the nondestructive testing of products and structures, ultrasound is used to detect invisible flaws. Industrially, ultrasound may be used for cleaning, mixing, and to accelerate chemical processes.

A phonon detector device 111 may be formed on IC die 102 using known or later developed processing techniques. Phonon detector device 111 may be fabricated using a piezoelectric material, for example. Phonon detector 111 may be designed to produce an electrical signal in response to detecting ultrasound phonons, for example. For another application, phonon detector may 111 may be designed to detect high frequency vibration and shock waves, for example. In some embodiments, phonon detector 111 may be a microelectromechanical system (MEMS) vibration sensor device. In other embodiments, phonon devices 110, 111 may be various forms of microphones, speakers, emitters, detectors, etc.

Some embodiments may include only phononic emitter device 110 or phononic detector device 111, while other embodiments may include both devices or multiple devices. In either case, additional signal processing circuitry may be included on IC die 102 and coupled to phononic devices 110, 111. The signal processing circuitry may be designed to receive digital data from a local storage or an external system and convert it to analog electrical signals that are then converted to ultrasonic waves 112 by phononic emitter device 110 and thereby launched into encapsulant material 120. The ultrasonic waves may travel through encapsulant material 120 and emerge from the surface of IC 100 where they may be directed to a test subject located nearby, for example.

Similarly, ultrasound waves 113 may be received from an external source and travel through encapsulation material 120 and be converted to electrical signals by detector 111 and then be provided to the signal processing circuitry for processing, storage, and/or communicating to another system, for example.

As will be described in more detail below a PBG structure within encapsulation material 120 may be used to guide ultrasound waves 112, 113 into and/or out of encapsulant material 120 by confining the ultrasound waves to a designated phononic channel region 115, for example. Phononic channel region 115 may also be referred to herein as a "bandpass channel" since it allows phonons within a selected band to pass through.

In this example, a solid encapsulant material 120 surrounds and encapsulates IC die 102. A portion of the encapsulation, material may in a matrix of interstitial nodes such as indicated at 121 that may be filled with a material that is different from encapsulation material 120. In this example, nodes 121 are arranged in a three dimensional array of spherical nodes that are in turn separated by a lattice of encapsulation material 123. Encapsulation material 123 may be the same or different as solid encapsulation material 120. The structure formed by the matrix of nodes 121 and lattice 123 will be referred to herein as a "phononic bandgap structure."

Solid encapsulant material 120 is typically an epoxy based material that provides mechanical protection and seals IC die 102 from environmental gases and liquids.

In this example, lattice 123 may be in contact at various places on the top or side surfaces of IC die 102. As mentioned above, lattice 123 may be formed from the same material as solid encapsulation material 120, or it may be formed using a different material by using an additive manufacturing process. The array of nodes 121 may be formed with one or more different materials. For example, some of the nodes 121 may be filled with a first material and some of the nodes 121 may be filled with different types of material. There may be a number (N) of different materials that are used to fill N different sets of nodes within encapsulation material 123. Node material may be a polymer or other material that has different intrinsic material properties from the lattice material 123.

For example, node material 121 may be air, some other gas, or even a vacuum in some embodiments. In other embodiments, node material 121 may be soft or rubbery. In another embodiment, certain nodes 121 may be filled with a hard material, while other nodes 121 are filled with a soft material, for example. The hardness or softness of each material may be referred to as the "acoustic impedance" of the material.

In the example of FIG. 1, lattice 123 forms a square three dimensional (3D) array of spherical nodes. In other embodiments, a differently shaped lattice may be formed to produce other shapes of arrays and nodes 121, such as: triangular, rectilinear, hexagonal, round nodes, elongated nodes, tubes, etc.

In some embodiments, die attachment 125 may be a thin layer of adhesive material. In other embodiments, die attachment 125 may include a portion 126 that is a phononic bandgap structure. As will be explained in more detail below, this may allow shielding a portion of the IC die 102 from acoustic noise that is transferred to thermal pad 104 from a substrate to which IC 100 is attached while still allow heat energy to propagate from IC die 102 to thermal pad 104, for example.

A phononic crystal is an artificially manufactured structure, or material, with periodic constitutive or geometric properties that are designed to influence the characteristics of mechanical wave propagation. When engineering these crystals, it is possible to isolate these waves within a certain frequency range. Conversely it may be more helpful to consider these waves as particles and rely on the wave-particle duality throughout the explanation. For this reason, any reference to propagation henceforth may refer to either wave movement or particle movement through the substrate. Propagation within this selected frequency range, referred to as the band gap, is attenuated by a mechanism of interferences within the periodic system. Such behavior is similar to that of a more widely known nanostructure that is used in semiconductor applications, a photonic crystal. The general properties and characteristics of phononic structures are known, for example, see; "Fundamental Properties of Phononic Crystal," Yan Pennec and Bahram Djarari-Rouhani, Chapter 2 of "Phononic, Crystals, Fundamentals and Applications" 2015, which is incorporated by reference herein.

Phononic crystals are formed by a periodic repetition of inclusions in a matrix. The elastic properties, shape, and arrangement of the scatterers may strongly modify the propagation of the acoustic/elastic waves in the structure. The phononic band structure and dispersion curves can then be tailored with appropriate choices of materials, crystal lattices, and topology of inclusions.

The propagation of acoustic waves in a phononic crystal may be governed by the Bloch or Floquet theorem from which one can derive the band structure in the corresponding Brillouin zone. The periodicity of the structures that defines the Brillouin zone may be in one (1D), two (2D), or three dimensions (3D).

The general mechanism for the opening of a band gap is based on the destructive interference of the scattered waves by the inclusions. This necessitates a high contrast between the elastic properties of the materials. In periodic structures, this is called the Bragg mechanism and the first band clap generally occurs at a frequency which is about a fraction of c/a, where "c" is a typical velocity of sound, and "a" is the period of the structure.

Phononic bandgap structures may be designed and modeled using simulation software available from various vendors. For example, physics-based systems may be modeled and simulated using COMSOL Multiphysics® simulation software from COMSOL®. "Multiphysics" and "COMSOL" are registered trademarks of COMSOL AB.

Figure 3:
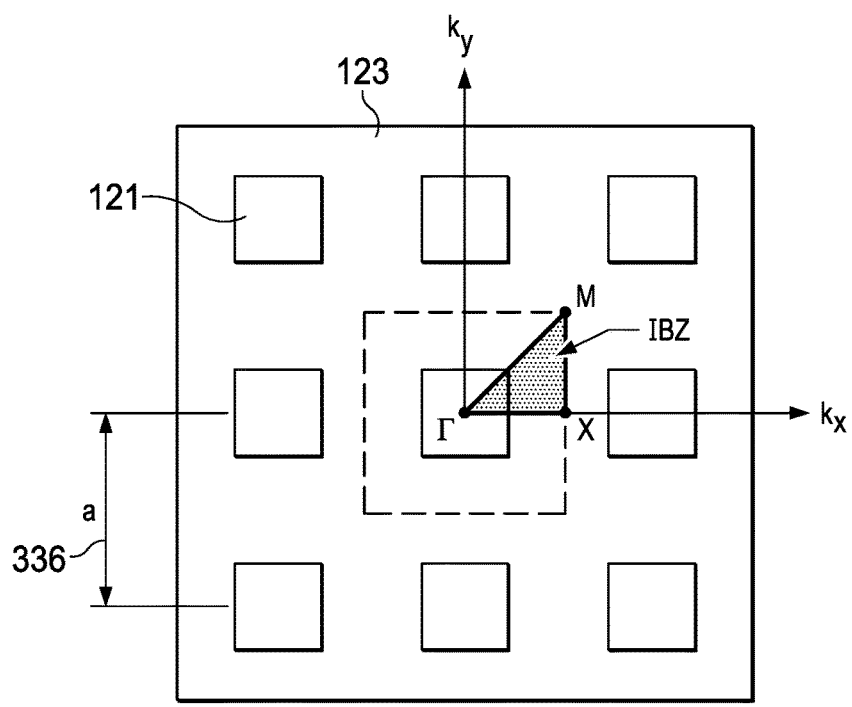
FIG. 3 is an example of another phononic bandgap structure having a square lattice.
Figure 2A:
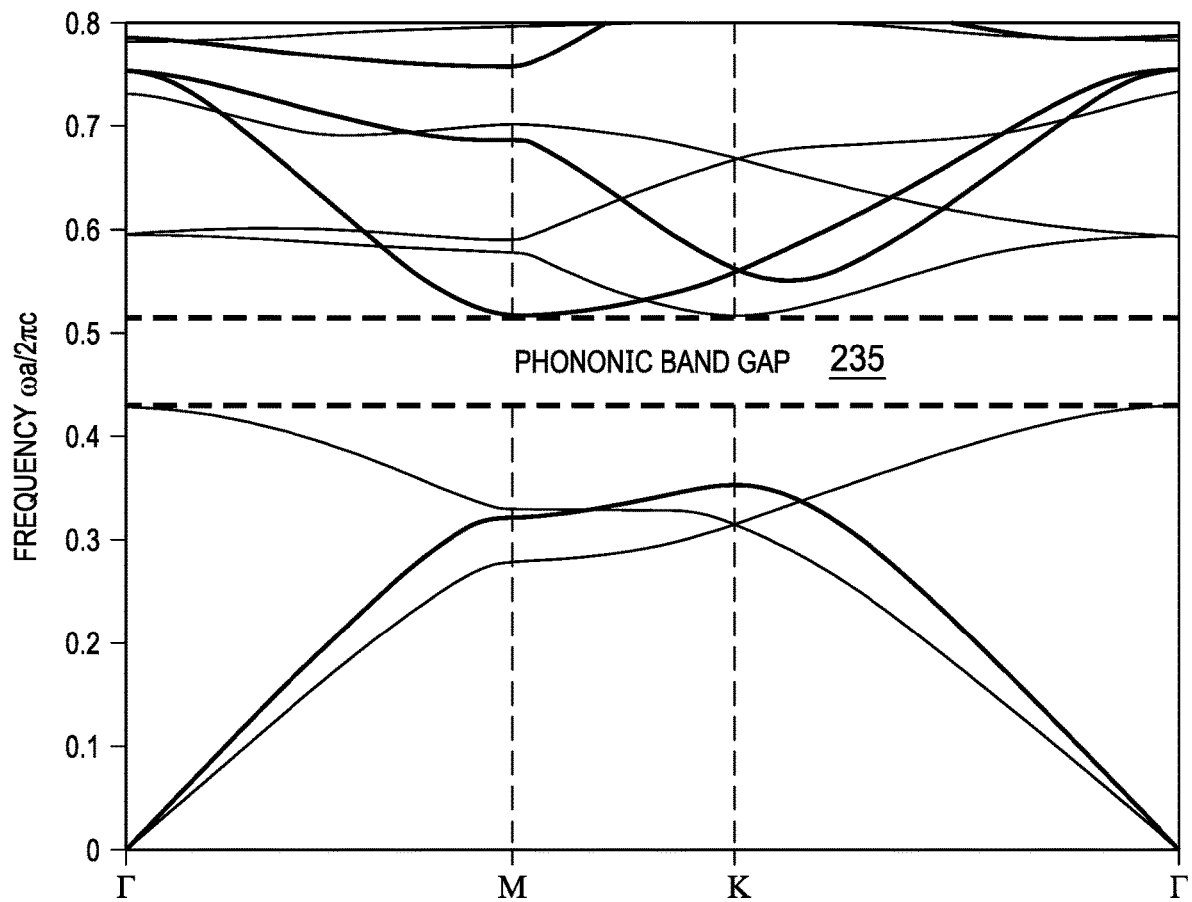
FIGS. 2A-2C is a frequency dispersion plot illustrating a band gap in a phononic bandgap structure having a hexagonal lattice.
Figure 2B:
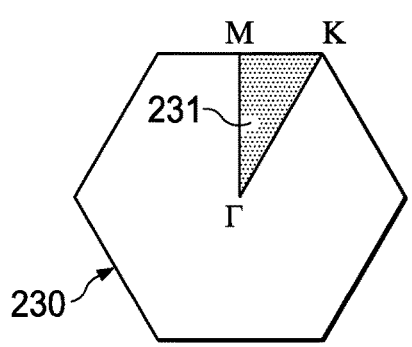
Figure 2C:
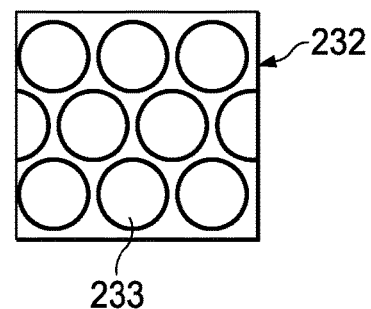

FIG. 2A is a frequency dispersion plot illustrating a band gap in a phononic bandgap structure having a hexagonal lattice. FIG. 2B illustrates a single cell 230 of the hexagonal matrix and illustrates Brillouin zone 231 for the hexagonal cell. FIG. 2C illustrates a larger portion of a hexagonal phononic crystal 232 formed by a 3D matrix of nodes as indicated at 233. FIG. 3 is an example of another phononic bandgap structure having a square lattice.

The x-axis of FIG. 2A represents the periphery of Brillouin zone 231 of phononic crystal 232 as defined by points Γ, M, and K. The y-axis represents the angular frequency of acoustic energy propagating in phononic crystal 232 in units of ωα/3πC. The various plot lines represent propagation paths through Brillouin zone 231. Region 235 represents a phononic band gap in which the propagation of waves falling within the defined band of frequencies is blocked by interference produced by the crystal lattice.

The width and the frequency range covered by a phononic bandgap depends on the periodic spacing of the nodes 233, which may be represented by lattice constant "a" as indicated at 336 in FIG. 3, and the relative difference between the acoustic impedance of the lattice material and the acoustic impedance of the nodes. For example, the frequency range covered by phononic bandgap 235 may be shifted to a higher frequency range for larger relative differences between the acoustic impedance of the lattice and the acoustic impedance of the nodes, while the phononic bandgap 235 may be shifted to a lower frequency range for smaller relative differences between the acoustic impedance of the lattice and the acoustic impedance of the nodes.

The phononic wavelength (λ) can be determined using expression (1), where the velocity (v) in materials is typically on the order of $10^3$-$10^5$ m/s and ν is the frequency of the phonon.

$$\text{lambda } (\lambda) = v/\nu \qquad (1)$$

For ultrasonic signals in the Mhz/Ghz frequency range, for example, the corresponding wavelengths in encapsulant material 120 may be in the range of several microns. The opening of phononic band gaps requires two main conditions. The first one is to have a large physical contrast, such as density and speed of propagation of the wave movements, between the nodes and the lattice. The second condition is to present a sufficient filling factor of the nodes in the lattice unit cell. The forbidden band gap occurs in a frequency domain given by the ratio of an effective propagation velocity in the composite material to the value of the lattice parameter of the periodic array of nodes. Referring to FIG. 3, as a rule of thumb the lattice dimension 336 may be selected to be about one half of the wavelength of the center of the target phononic bandgap.

Figure 4:
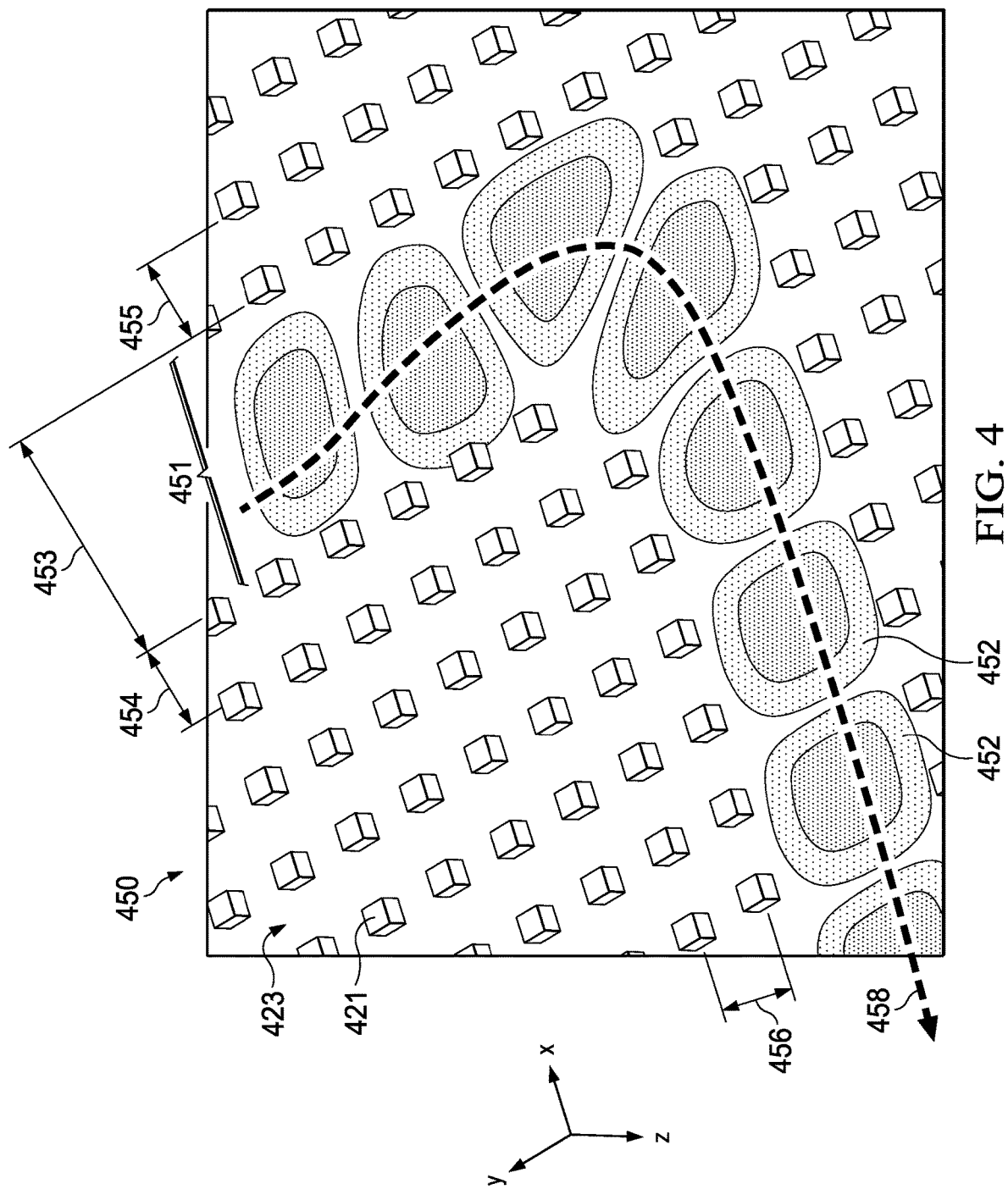
FIG. 4 is a simulation illustrating an example channel formed by a phononic bandgap structure.

FIG. 4 is a simulation that illustrates the propagation of phonons through an example phononic channel 451 formed by an example phononic bandgap structure 450. This example illustrates the operation of phononic channel 115 that may be formed in IC 100, referring back to FIG. 1. As described above, a phononic bandgap structure may be formed within encapsulation material 423 by inserting a matrix of nodes 421 with a periodic spacing. In this example, the x-axis node spacing 454 is approximately equal to the y-axis node spacing 456. The z-axis node spacing (not shown) is also approximately the same as node spacing 454, 456 in this example.

The node spacing 454-556 in this example may be selected to be approximately 10 μm, for example. Phononic channel 451 may be formed by not having any nodes within the region 451. In this manner, acoustic energy wave movement in the form of phonons 452 that fall within the bandgap frequency range of PBG structure 450 that enter region 451 may blocked from penetrating into PBG structure 450. Thus, region 451 may be formed by omitting nodes within this region.

The size 453 of phononic channel 451 may vary based on the application. In some embodiments, the width 453 of phononic channel 451 may be just a few times the lattice constant, as illustrated here. In other embodiments, the width 453 may be arbitrarily large.

Figure 5:
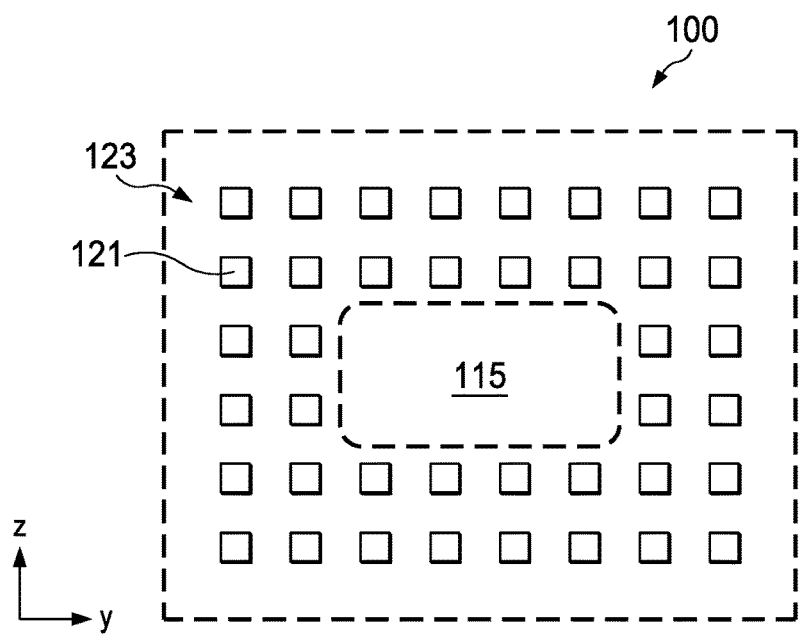
FIGS. 5 and 6 are a cross sectional views of example phononic channels.

FIG. 5 is a cross sectional view of an example embodiment of phononic channel 115 as shown in FIG. 1 that may be formed in IC 100 of FIG. 1. FIG. 5 illustrates an example top cross sectional view of phononic channel 115 that is more or less rectangular. Other cross sectional shapes may be implemented by selective omission of nodes. For example, a relatively wide phononic channel may be implemented, a relatively tall phononic channel may be implemented, a circular or oval cross section may be implemented, etc.

Figure 6:
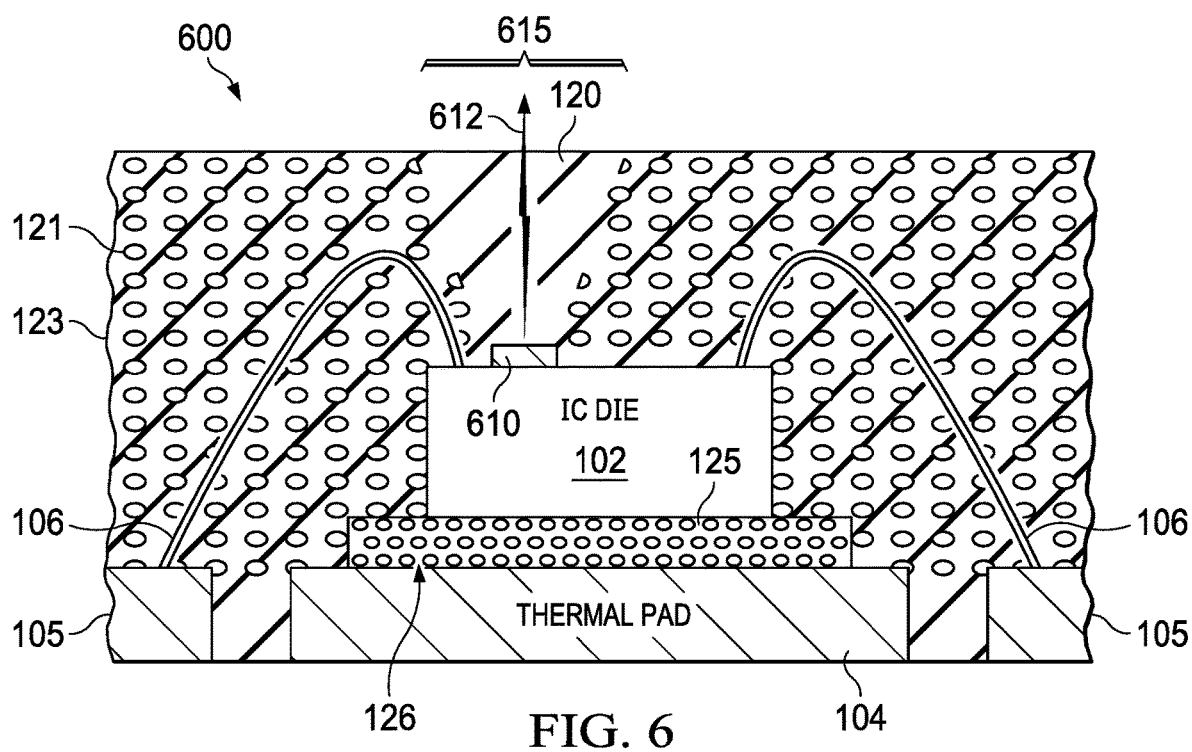

FIG. 6 is a cross sectional view of an example IC package 600 that includes a phononic bandgap structure within the encapsulant material 120. Phonon device 610 may be similar to phonon devices 110 or 111 and be fabricated on IC die 602 as described in more detail with regard to FIG. 1. In this example, phononic channel region 615 may have a conical or parabolic, shape in order to more effectively guide phonon wave 612 from phononic emitter 110 to the outer surface of IC 600. In this example, a portion of the phonon waves 612 may reflect off the conical wall of PBS structure 121/123. As described above with regard to FIGS. 4, 5, phononic channel 615 may be formed by simply omitting nodes 123 from region 615 during the additive manufacturing process. The shape and size of phononic channel 615 may be easily configured by selective placement of nodes 123 during the additive manufacturing process.

Figure 7:
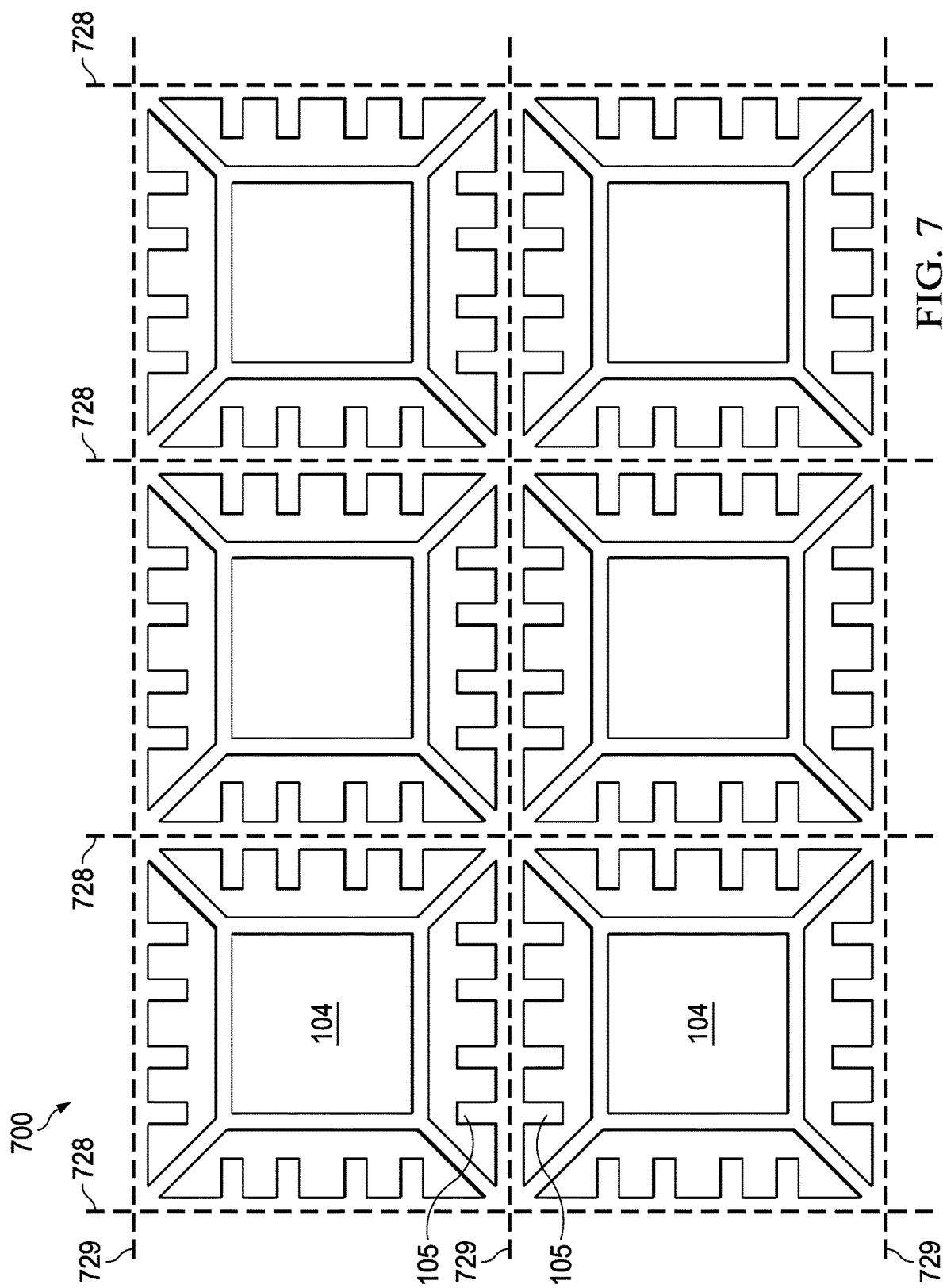
FIG. 7 is a top view of an example leadframe.

FIG. 7 is a too view of an example QFN leadframe 700 that may be used to support IC 100 in FIG. 1, for example.

Other types of packages may use a leadframe strip that has a different known or later developed configuration. Lead frame strip 700 may include one or more arrays of individual lead frames. Lead frame strip 700 is typically fabricated from a copper sheet that is etched or stamped to form a pattern of thermal pads and contacts. Lead frame strip 700 may be plated with tin or another metal that will prevent oxidation of the copper and provide a lower contact surface that is easy to solder. An IC die may be attached to each individual lead frame.

Each individual leadframe may include a thermal pad, such as thermal pads 104. Thermal pad 104 may also be referred to as a "die attach pad," Each individual lead frame also includes a set of contacts that surround the thermal pad, such as contacts 105. A sacrificial strip of metal connects all of the contacts together and provides mechanical support until a sawing process removes it. An IC die may be attached to each thermal pad during a packaging process. Wire bonding may then be performed to connect bond pads on each IC chip to respective contacts on the lead frame. The entire lead frame strip 700 may then be covered with a layer of mold compound using an additive process as described in more detail below to encapsulate the ICs. Lead frame strip 700 may then be singulated into individual packaged ICs by cutting along cut lines 728, 729.

Figure 8C:
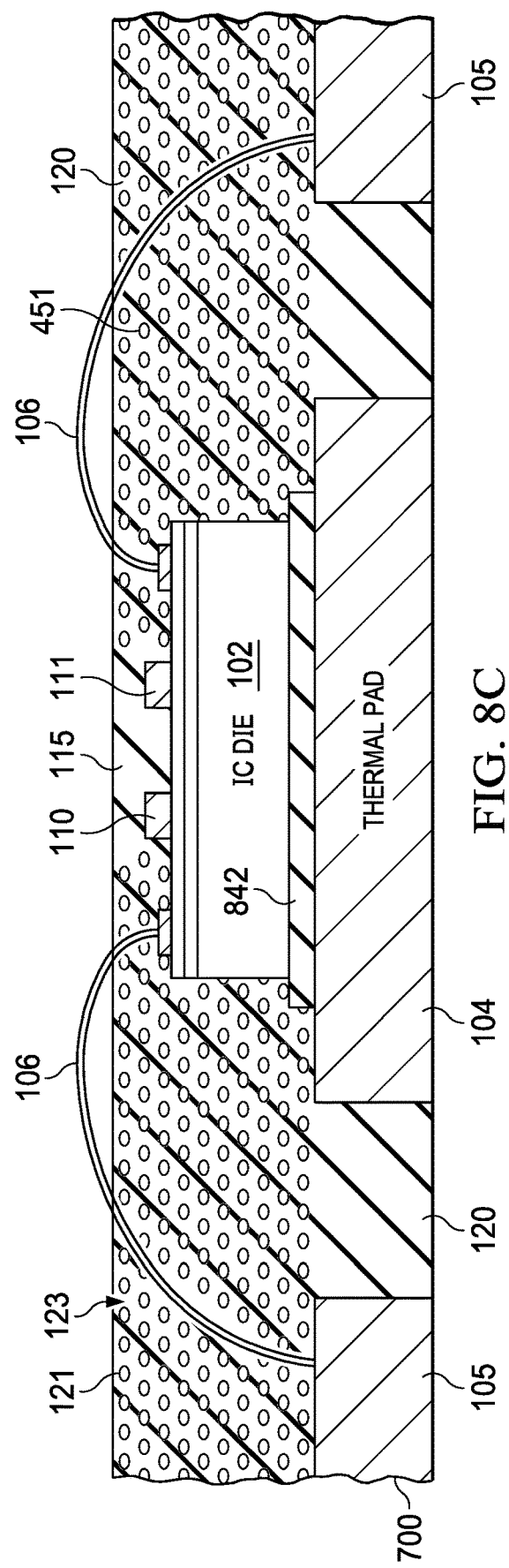

FIGS. 8A-8C are cross sectional views illustrating fabrication of the example IC package 100 of FIG. 1. IC die 102 may be attached by die attach layer 842 to a thermal pad 104 of a leadframe that may be part of a leadframe strip similar to leadframe strip 700 shown in FIG. 7 that includes a set of contacts 105. One or more conductive layers may be formed on the epi layer and patterned into interconnect traces and bond pads 843. A set of bond wires 106 may be attached to contacts 105 and bond pads 843 located on the surface of IC die 102 using known or later developed electrical connection techniques. In this example, IC package 100 is a quad-flat no-leads (QFN) package; however, in other embodiments various known or later developed packaging configurations, such as DFN, MLF, SON, dual inline packages (DIP), etc, may be fabricated using the techniques disclosed herein to form an encapsulated package with an acoustic directing phononic bandgap structure included with the encapsulant material.

FIG. 8B is a cross sectional view illustrating partial formation of encapsulation material 120. Additive manufacturing processes are now being used in a number of areas. The International Association for Testing Materials (ASTM) has now promulgated ASTM F7292-12a "Standard Terminology for Additive Manufacturing Technologies" 2012 which is incorporated by reference herein. Currently, there are seven families of additive manufacturing processes according to the ASTM F2792 standard, including: vat photopolymerization, powder bed fusion, binder jetting, material jetting, sheet lamination, material extrusion, directed energy deposition. Hybrid processes may combine one or more of these seven basic processes with other manufacturing processes for additional processing flexibility.

In this example, a vat photopolymerization process may be used in which leadframe strip and the ICs attached to it, such as IC die 102, are lowered into a vat of liquid photo polymer resin. A light source, such as a laser or projector, may then expose selected regions of the liquid photopolymer resin to initiate polymerization that converts exposed areas of the liquid resin to a solid. In this manner, layers of encapsulant material 120 may be formed in selected shapes. For example, encapsulant material that forms lattice 123 may be the same or different as the solid enscapsulant material 120. Nodes 121 may be formed with a selected lattice spacing.

FIG. 8C is a cross sectional view illustrating further partial formation of encapsulation material 120 around IC die 102. Additional layers of liquid encapsulation material 120 have been exposed and converted to a solid. Selective exposure of the liquid resin allows lattice 123 to be formed with nodes 121, as described with regard to FIG. 1. One or more phononic channels 115 may be formed by varying the spacing of nodes 121 as the layers of encapsulant material are built up.

The leadframe strip may be submerged in different vats at different times in order to allow different materials to form the nodes 121 within lattice 123.

The nearly complete formation of phononic channel 115 may be seen in FIG. 8C. Phononic waves may be conducted between the top surface of fully encapsulated IC 100 and phononic devices 110, 111 while being blocked from reaching other regions of encapsulation material 120 by a phononic, bandgap structure that includes lattice 123 and periodically spaced nodes 121.

Additional layers of resin may be exposed and hardened to form the final outside encapsulation layer illustrated in FIG. 1. The leadframe strip may then be sawed or otherwise separated into individual encapsulated IC packages.

In another embodiment, other additive manufacturing processes may be used to form encapsulation material 120. For example, a powdered bed diffusion process may be used in which a powdered material is selectively consolidated by melting it together using a heat source such as a laser or electron beam.

In another embodiment, a material jetting process may be used in which droplets of material are deposited layer by layer to produce an acoustic directing encapsulation structure as described herein. However, bond wires 106 may require extra care to avoid disrupting the droplet streams.

In another embodiment, bond wires are not initially bonded to contacts 105 and bond pads 843. In this example, a material jetting process may be used in which droplets of material are deposited layer by layer to produce a phononic bandgap structure as described herein. As part of the material jetting process, a conductive material may be deposited to form the bond wires between contacts 105 and bond pads 843. In some embodiments, a sintering process may be done by heating the encapsulated leadframe 700 assembly to further solidify the bond wires. The leadframe strip 700 may then be sawed or otherwise separated into individual encapsulated IC packages.

In another embodiment, IC die 102 is not initially attached to thermal pad 104 of a leadframe that may be part of a leadframe strip similar to leadframe strip 700 shown in FIG. 7. In this example, a vat photopolymerization process may be used in which the leadframe strip is lowered into a vat of liquid photopolymer resin. A light source, such as a laser or projector, may then expose selected regions of the liquid photopolymer resin to initiate polymerization that converts exposed areas of the liquid resin to a solid. In this manner, layers of encapsulant material 120 may be formed in selected shapes. In this manner, a phononic bandgap structure 126 as shown in FIG. 1 may be fabricated on top of thermal pad 104 to isolate a later attached IC die from phononic waves arriving from thermal pad 104 while still letting heat energy propagate from the IC die to the thermal pad. Spaces may be left above each contact 105 for later attachment of bond wires. A set of bond wires 106 may be attached to contacts 105 and bond pads 643 located on the surface of IC die 106 using known or later developed wire bonding techniques. Additional layers of resin may be exposed and hardened to form an additional phononic bandgap structure as described with regard to FIGS. 8A-8C, for example. The leadframe strip may then be sawed or otherwise separated into individual encapsulated IC packages.

In another embodiment, the phononic bandgap structure may be fabricated using a lattice material that includes filler particles in place of the explicitly formed nodes as described above, such as nodes 121. In this case, the filler particles are selected to have a size and material composition that will influence the characteristics of mechanical wave propagation, as described above. The filler material may be a polymer or other material that has different intrinsic material properties from the lattice material, in a similar manner as the difference between nodes 121 and lattice material 123. In some embodiments, the filler material may be hard, while in other embodiments the filler material may be soft or rubbery.

In another embodiment, multiple phononic bandgaps may be formed by using two or more types of fillers. For example, a portion of the filler material may be a hard material, while another portion of the filler material may be a soft material. In some embodiments, different size filler particle may be used in different regions or in a same region to form multiple bandgaps. In some embodiments, a different number of filler particles per unit volume may be used in different regions to form different bandgaps.

In this case, the filler dispersion will not be perfectly crystalline, but there will be a statistical mean separation of the filler particle that may lend itself to a bandgap based on the statistical mean separation distance of the filler particles.

An additive manufacturing process may be used to encapsulate an IC die using two or more different polymers, such as one with filler particles and one without filler particles to form the PBG structures as described herein or other configurations of PBG structures.

Alternatively, a selective molding process may be used in which one area of the encapsulation is molded with first polymer having either no filler particles or a first configuration of filler particles (size, material, number of particles per unit volume, etc.) and other areas are molded with a polymer having a different filler particle configuration to form a PBG structure as described herein or other configurations of PBG structures.

Figure 9:
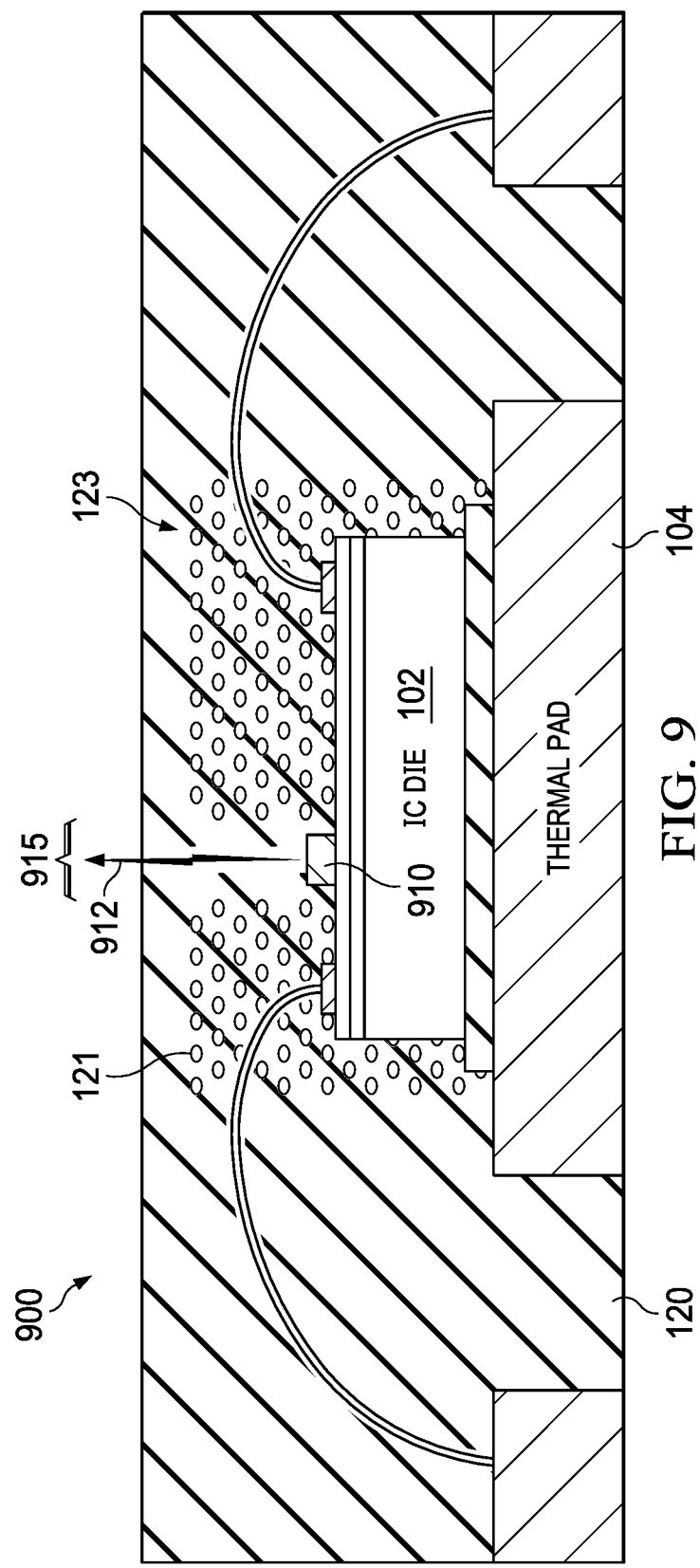
FIG. 9 is a cross sectional view of another embodiment of an IC with a phononic bandgap structure.

FIG. 9 is a cross sectional view of another embodiment of an IC 900 with a phononic bandgap structure that includes lattice 123 that includes periodically spaced nodes 121. In this example, a phononic directing channel 915 is positioned to direct phononic waves 912 produced by phononic device 910 on IC 902, while blocking the phononic waves from other portions of encapsulation material 120 using a phononic bandgap structure as disclosed herein. In this example, the phononic bandgap structure may be formed in a smaller region of encapsulant material 120 but still effectively guide phononic waves 912.

In other embodiments, a relatively small phononic bandgap structure may be fabricated during the encapsulation process to provide phononic guidance in a limited area of the encapsulation material.

Figure 10A:
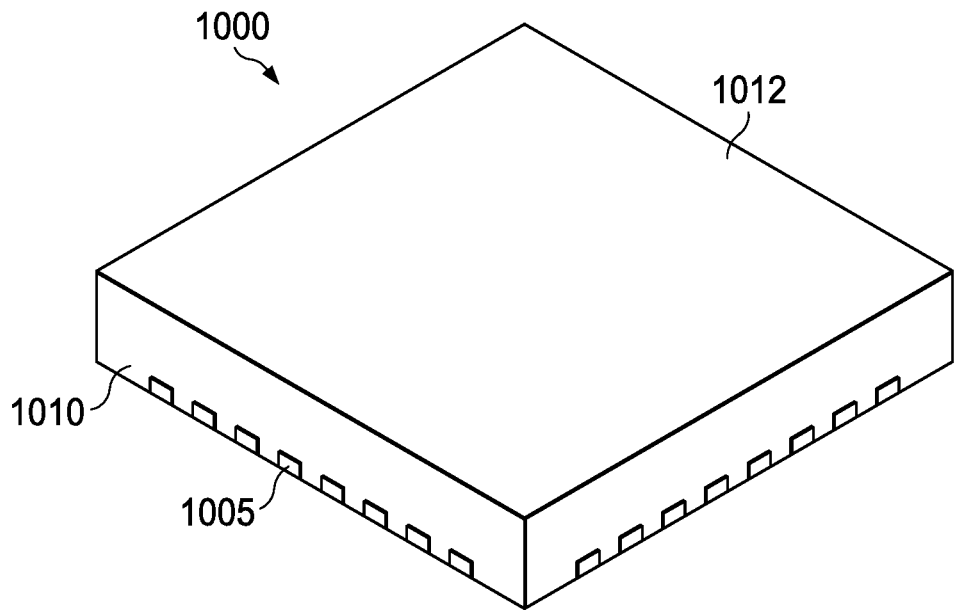
FIGS. 10A-10B illustrate a top and bottom view of an example IC package containing a phononic band structure.
Figure 10B:
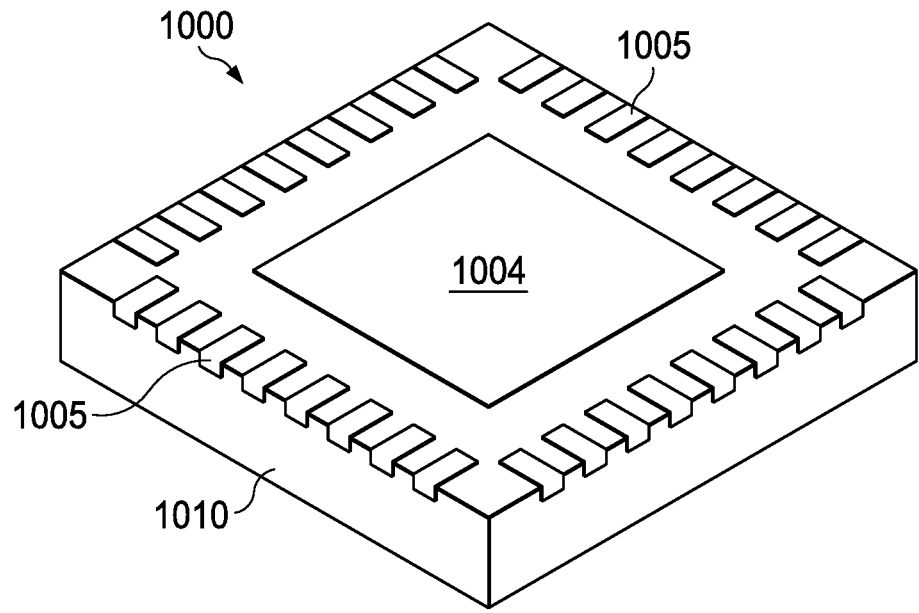

FIG. 10A-10B are top and bottom views of an example IC package 1000 that includes a phononic directing phononic bandgap structure within the encapsulant material as described herein. IC 1000 is an illustration of a quad-flat no-leads (QFN) IC package that was encapsulated using additive manufacturing process to form phononic directing structures within the encapsulation material as described herein. FIG. 10A illustrates a top side and FIG. 10B illustrates a bottom side of QFN package 1000. Flat no-leads packages such as quad-flat no-leads (QFN) and dual-flat no-leads (DFN) physically and electrically connect integrated circuits to printed circuit boards. Flat no-leads, also known as micro leadframe (MLF) and SON (small-outline no leads), is a surface-mount technology, one of several package technologies that connect ICs to the surfaces of PCBs without through-holes. Flat no-lead is a near chip scale plastic encapsulation package made with a planar copper lead frame substrate. Perimeter lands on the package bottom provide electrical connections to the PCB. Flat no-lead packages include an exposed thermal pad 1004 to improve heat transfer out of the IC (into the PCB). Heat transfer can be further facilitated by metal vies in the thermal pad. The QFN package is similar to the quad-flat package and a ball grid array.

QFN package 1000 includes a set of contacts 1005 arrayed around the perimeter of the package on the bottom side. Thermal pad 1004 has an exposed surface on the bottom side of QFN 1000. An integrated circuit die (not shown) is mounted to the other side of thermal pad 1004. The entire assembly is encapsulated in an encapsulation material 1010 using an additive manufacturing process as described herein to form a phononic directing phononic bandgap structure. While a QFN is illustrated in FIGS. 10A-10B, other embodiments may use other types of integrated circuit packages.

Figure 11:
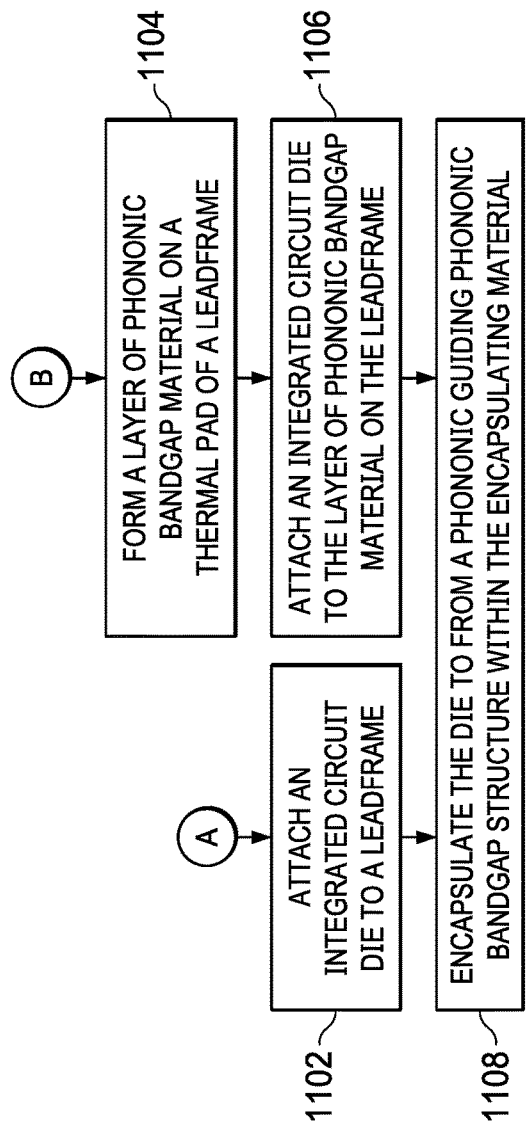
FIG. 11 is a flow chart illustrating an example process for formation of a phononic bandgap structure within an IC package.

FIG. 11 is a flow diagram illustrating fabrication of the example IC of FIG. 1. In one embodiment, as described above in more detail, an IC die may be attached to a thermal pad of a leadframe that includes a set of contacts as indicated at box 1102. The IC die may be fabricated using known or later developed semiconductor processing techniques. The IC die may include an epitaxial (epi) layer on the top surface in which are formed various semiconductor transistor devices and interconnects. One or more conductive layers may be formed on the epi layer and patterned into interconnect traces and bond pads. A set of bond wires may be attached to the contacts and bond pads located on the surface of the IC die using known or later developed wire bonding techniques.

In another embodiment, a layer of phononic guiding material that includes a phononic bandgap structure may be first formed on the thermal pad of the leadframe, as indicated at 1104. The encapsulation material may be formed into a lattice with periodically spaced nodes that are filled with a different type of material to form a phononic bandgap structure. As described above in more detail, an additive manufacturing process may be used to create the lattice and fill the nodes in the lattice.

An IC die may then be attached to the layer of phononic guiding encapsulation material, as indicated at 1106.

In either case, the IC die may then be completely encapsulated by an additive process to form a phononic guiding structure within the encapsulation material as indicated at 1108. A first portion of the encapsulation material may be solid and a second portion of the encapsulation material may include nodes filled with a second material to form a phononic bandgap structure. As described above in more detail, an additive manufacturing process may be used to create a lattice and fill the periodically spaced nodes in the lattice with a different type of material, or with several different types of material in different locations.

In another embodiment, the encapsulation process indicated at box 1108 may be done using a selective molding process in which one area of the encapsulation is molded with first polymer having either no filler particles or a first configuration of filler particles (size, material, number of particles per unit volume, etc.) and other areas are molded with a polymer having a different filler particle configuration to form a PBG structure as described herein or other configurations of PBG structures.

As discussed above in more detail, various types of IC packages may be formed in this manner. For example, a quad-flat no-leads (QFN) package is illustrated in FIGS. 1-4. However, in other embodiments various known or later developed packaging configurations, such as DEN, MLF, SON, dual inline packages (DIP), etc, may be fabricated using the techniques disclosed herein to form an encapsulated package with stress directing material included with the encapsulant material.

Figure 12:
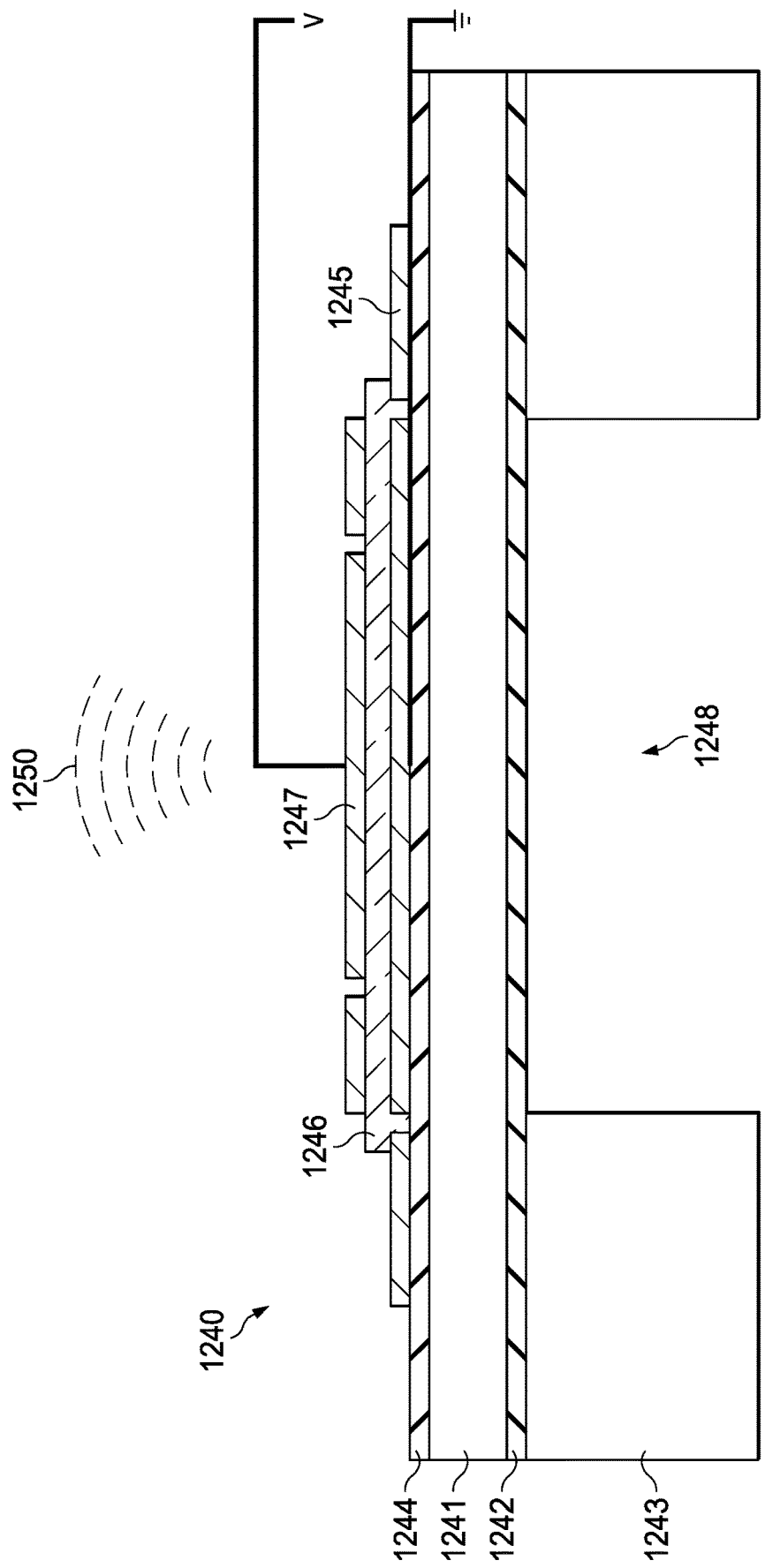
FIG. 12 is a cross sectional view of an example ultrasonic emitter device.

FIG. 12 is a cross sectional view of an example phononic device 1240. Phononic device 110 as shown in FIG. 1 may be similar to phononic device 1240, for example. Phononic device 1240 is an example of an ultrasonic emitter that may be implemented with a layer of piezoelectric material 1246 sandwiched between two conductive layers 1245, 1247. In this example, conductive layers 1245, 1247 are fabricated from a layer of titanium and platinum, but other embodiments may use other types of metals or conductive materials. Conductive layers 1245, 1247 and piezoelectric layer 1246 may be fabricated to have a generally circular shape when viewed from the top of device 1240, for example. An oscillating voltage signal V may be impressed across conductive layers 1245, 1247 to cause piezoelectric layer 1246 to mechanically vibrate and thereby emit a stream of ultrasonic phonons 1250.

Phononic device 1240 may be fabricated on a substrate 1241 which in this example is silicon with a passivation layer 1242, 1244 of silicon oxide. Substrate 1241 may be a thin layer of silicon that acts as a vibrating membrane in response to piezoelectric layer 1246. Another layer 1243 of silicon may be formed adjacent passivation layer 1242. A cavity 1248 may be formed in layer 1243 to allow piezoelectric layer 1246 and membrane layer 1241 to vibrate. Cavity 1248 may be formed in layer 1243 by back etching using passivation layer 1242 as an etch stop, for example.

Phononic device 1240 is merely an example of a phononic device that may be used in an encapsulated IC, as illustrated in FIG. 1. Other known or later developed phononic devices may also be used.

Figure 13:
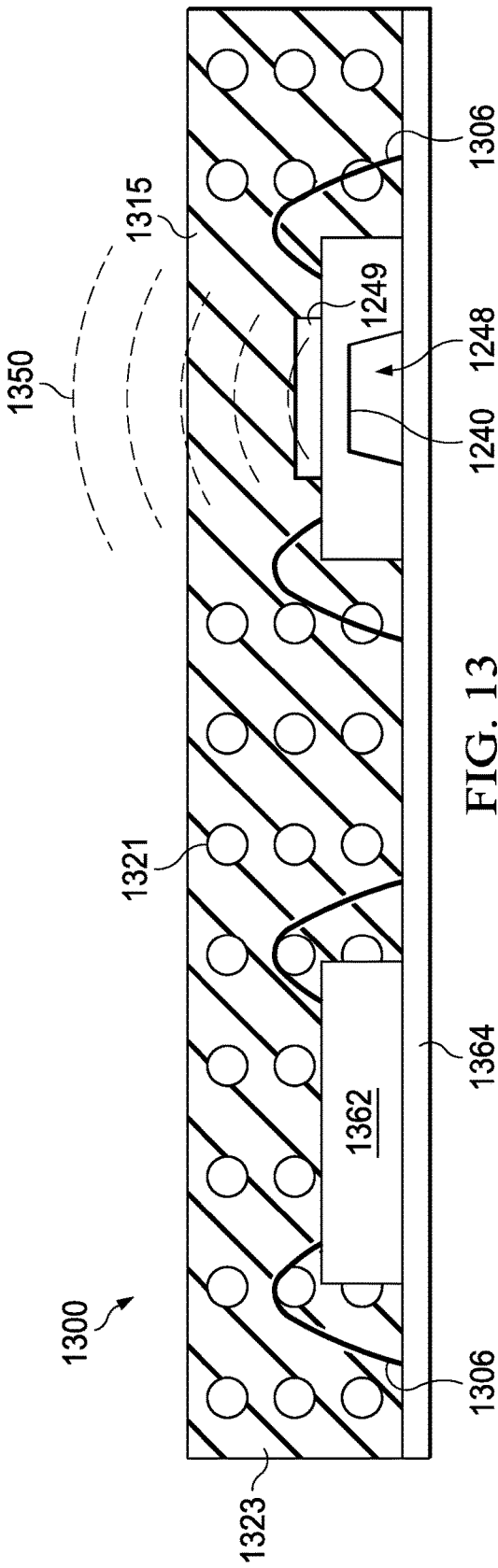
FIG. 13 is a cross sectional view of a multichip module that includes the ultrasonic emitter of FIG. 12 and a signal processing C.

FIG. 13 is a cross sectional view of a multichip module (MCM) 1300 that includes the ultrasonic phononic device 1240 of FIG. 12. In this example, a second IC die 1362 is included in MCM 1300 that may include signal processing circuitry that may be coupled to phononic device 1240. Phononic device 1240 and IC die 1362 may both be mounted on a substrate 1364 that may also be a leadframe. Bond wires 1306 may be used to couple contact pads on each device to signal traces on substrate 1364.

MCM module 1300 may be encapsulated as described above in more detail to form a PBG structure using nodes or particles 1321 that are dispersed in encapsulant material 1323. A bandpass region 1315 may be formed is described above in more detail by leaving out nodes or particles 1321 in the band as region. As discussed above, an additive manufacturing process may be used to form nodes 1321 in a periodic matrix. Alternatively, a selective molding process may be used with encapsulation material having a selected density of filler particles to form a PBG structure and an encapsulation material with no filler particles to form band as region 1315, for example. Cavity region 1248 and region 1249 above phononic device 1240 may be left clear encapsulant to allow for vibration of the device membrane 1241, as shown in FIG. 12.

Phononic device 1240 may be configured to receive an analog signal from the signal processing circuitry on IC die 1362 and convert it into a stream of phonons 1350 that may then be guided through bandpass region 1315 by the PBG structure formed by nodes/particles 1321 and emitted from the surface of MCM 1300.

Alternatively, phononic device 1240 may be configured to receive a stream of phonons 1350 that may be impinging on a surface of MCM 1300 and then be guided through bandpass region 1315 by the PBG structure formed by nodes/particles 1321. Phononic device 1240 may generate an analog signal in response to the received phonons and pass the analog signal to the processing circuitry on IC die 1362 for further processing and storage.

In another embodiment, there may be two or more phononic devices such as device 1240 included within a single MCM.

Other Embodiments

While the disclosure has been described with reference to illustrative embodiments, this description is not intended to be construed in a limiting sense. Various other embodiments of the disclosure will be apparent to persons skilled in the art upon reference to this description. For example, in some embodiments, the lattice material may be relatively soft and the node material may be relatively hard. In other embodiments, the lattice material may be relatively soft and the node material may be relatively hard. In some embodiments, the node material may be air, another gas, or a vacuum, for example.

In some embodiments, a portion of the nodes may be formed with one kind of material, while another portion of the nodes may be formed with a different material. Several different types of material may be used to form different sets of nodes within the phononic bandgap structure to thereby tailor the performance of the phononic ban gap structure.

In some embodiments a portion of the nodes may be formed with one lattice constant, while another portion of the nodes may be formed with a different lattice constant. Several different lattice constants may be used to form different sets of nodes within the phononic bandgap structure to thereby tailor the performance of the phononic bandgap structure.

In some embodiments, the PBG structure may be symmetric in 3D, while in other embodiments the PBG structure may be asymmetric with different lattice spacing in different directions.

In some embodiments, the PBG structure may have a bandgap that is effective in all directions, while in other embodiments the PBG structure may have a bandgap in one direction but not in another direction, for example.

While a phononic guiding channel, such as channel 115 as shown in FIG. 1 and channel 615 as shown in FIG. 6 or a phononic deflecting layer such as layer 126 as shown in FIG. 1 were disclosed herein, other embodiments may implement a wide layer in which a phononic bandgap is present. For example, in another embodiment, an IC die may be partially or completely surrounded by a phononic bandgap structure in the form of an enclosure that surrounds the IC, such as a box shaped or spherical shaped enclosure that is formed within the encapsulation material by selective placement of nodes within the encapsulation material such that phononic wave energy is blocked from reaching the IC or blocked from being emitted by the IC.

As described above, a phononic channel may be formed through a PBG structure by simply omitting the interstitial nodes within the channel to thereby form a bandpass channel. In another embodiment, a bandpass channel may be formed by superimposing several different PBG structures having different bandgaps, for example.

Another example may demonstrate packages that are entirely encased in mold compound, such as a DIP (dual inline package). In this case there is not a thermal pad that is in contact with the board. The only direct electrical contact with the board is through the pin legs.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the disclosure should not be considered limited to the specific ordering of steps shown in the figures and/or described herein.

It is therefore contemplated that the appended claims will cover any such modifications of the embodiments as fall within the true scope and spirit of the disclosure.

What is claimed is:

1. Apparatus comprising:
   an integrated circuit (IC) die including transistor devices and interconnects;
   a phonon device on the IC die, the phonon device configured to emit or to receive phonons having a first frequency range;
   an encapsulation material encapsulating the IC die and the phonon device, the encapsulation material having an outer surface;
   a phononic bandgap (PBG) structure within the encapsulation material, the PBG structure having a phononic bandgap with a second frequency range that includes at least a portion of the first frequency range; and
   a bandpass channel through the PBG structure between the phonon device and the outer surface.

2. The apparatus of claim 1, wherein the bandpass channel is a conical shaped region surrounded by the PBG structure.

3. The apparatus of claim 1, wherein the bandpass channel is a cylindrical shaped region surrounded by the PBG structure.

4. The apparatus of claim 1, further comprising:
   a thermal pad on which the IC die is mounted;
   in which a portion of the phononic bandgap structure is between the IC die and the thermal pad.

5. The apparatus of claim 1, wherein the phononic bandgap structure includes a matrix of periodically spaced nodes within the encapsulation material, in which the encapsulation material has a first acoustic impedance, and the nodes have a second acoustic impedance that is different from the first acoustic impedance.

6. The apparatus of claim 5, wherein the second acoustic impedance is greater than the first acoustic impedance.

7. The apparatus of claim 1, wherein the phononic structure includes a diffusion of filler particles within the encapsulation material, the encapsulation material has a first acoustic impedance, and the filler particles have a second acoustic impedance that is different from the first acoustic impedance.

8. The apparatus of claim 1, wherein the phonon device is a first phonon device, the apparatus further comprises a second phonon device on the IC die, and the second phonon device is configured to emit or to receive phonons having a third frequency range through the bandpass channel between the second phonon device and the outer surface.

9. A method, comprising:
   attaching a phonon device on an integrated circuit (IC) die, the IC die including transistor devices and interconnects;
   attaching the IC die to a leadframe; and
   forming a phononic bandgap (PBG) structure by encapsulating the IC die and the phonon device within an encapsulation material, in which the encapsulation material has an outer surface, and a bandpass channel extends through the PBG structure between the phonon device and the outer surface.

10. The method of claim 9, wherein the PBG structure includes a matrix of periodically spaced nodes within the encapsulating material, in which the encapsulation material has a first acoustic impedance, and the nodes have a second acoustic impedance that is different from the first acoustic impedance.

11. The method of claim 10, wherein forming the PBG structure includes forming the bandpass channel by omitting nodes within a region of the PBG structure.

12. The method of claim 9, wherein forming the PBG structure comprises:
    forming a first matrix of periodically spaced nodes within the encapsulating material, the first matrix having a first lattice constant; and
    forming a second matrix of periodically spaced nodes within the encapsulating material, the second matrix having a second lattice constant.

13. The method of claim 9, wherein forming the PBG structure comprises:
    forming a first matrix of periodically spaced nodes within the encapsulating material, the first matrix having a first acoustic impedance; and
    forming a second matrix of periodically spaced nodes within the encapsulating material, the second matrix having a second acoustic impedance.

14. The method of claim 9, wherein forming the PBG structure includes diffusing filler particles within the encapsulation material.

15. A method, comprising:
    emitting or receiving ultrasonic waves having a first frequency range from or to a phonon device on an integrated circuit (IC) die, the IC die including transistor devices and interconnects;
    conducting the ultrasonic waves through a phononic channel within an encapsulation material that encapsulates the IC die and the phonon device, in which the encapsulation material has an outer surface, and the phononic channel extends between the phonon device and the outer surface; and confining the ultrasonic waves to the phononic channel by a phononic bandgap (PBG) structure within the encapsulation material, in which the PBG structure has a phononic bandgap with a second frequency range that includes at least a portion of the first frequency range.

16. The method of claim 15, wherein confining the ultrasonic waves includes reflecting a portion of the ultrasonic waves from a conical surface of the PBG structure within the encapsulation material.

17. The method of claim 15, wherein the ultrasonic waves are first ultrasonic waves, and the method further comprises:

conducting second ultrasonic waves having a third frequency range through the phononic channel; and emitting or receiving the second ultrasonic waves from or to a second phonon device on the IC die.

* * * * *